United States Patent
Stockinger et al.

(10) Patent No.: US 8,228,109 B2
(45) Date of Patent: Jul. 24, 2012

(54) TRANSMISSION GATE CIRCUITRY FOR HIGH VOLTAGE TERMINAL

(75) Inventors: Michael A. Stockinger, Austin, TX (US); Jose A. Camarena, Austin, TX (US); Wenzhong Zhang, Tranjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 103 days.

(21) Appl. No.: 12/824,991

(22) Filed: Jun. 28, 2010

(65) Prior Publication Data
US 2011/0316610 A1     Dec. 29, 2011

(51) Int. Cl.
*H03K 5/08* (2006.01)
(52) U.S. Cl. ......... 327/318; 327/319; 327/436; 327/437
(58) Field of Classification Search ............... 327/318, 327/319, 434, 436–437
See application file for complete search history.

(56) References Cited

U.S. PATENT DOCUMENTS

| | | | |
|---|---|---|---|
| 4,930,037 A | 5/1990 | Woo | |
| 6,097,238 A * | 8/2000 | Zhou | 327/390 |
| 6,127,855 A | 10/2000 | Taft et al. | |
| 6,307,420 B1 * | 10/2001 | Zhou | 327/390 |
| 6,462,611 B2 * | 10/2002 | Shigehara et al. | 327/534 |
| 6,795,369 B2 | 9/2004 | Choi et al. | |
| 6,834,336 B2 | 12/2004 | Takayama et al. | |
| 6,975,271 B2 * | 12/2005 | Adachi et al. | 343/700 MS |
| 7,286,001 B2 * | 10/2007 | Nakatsuka et al. | 327/308 |
| 7,514,983 B2 | 4/2009 | Miske | |
| 2003/0218231 A1 | 11/2003 | Mehdi et al. | |
| 2005/0189963 A1 | 9/2005 | Osamu | |

OTHER PUBLICATIONS

PCT/US2011/035727 International Search Report and Written Opinion mailed Dec. 26, 2011.

* cited by examiner

*Primary Examiner* — Kenneth B. Wells
(74) *Attorney, Agent, or Firm* — David G. Dolezal; Joanna G. Chiu

(57) ABSTRACT

A transmission gate circuit includes a first transmission gate, having a first switching device, coupled in series with a second transmission gate, having a second switching device, and control circuitry which places the first transmission gate and the second transmission gate into a conductive state to provide a conductive path through the first transmission gate and the second transmission gate. When the voltage of the first terminal is above a first voltage level and outside a safe operating voltage area of at least one of the first and second switching device, the first switching device remains within its safe operating voltage area and the second switching device remains within its safe operating voltage area.

22 Claims, 6 Drawing Sheets

PMOS

ISOLATED NMOS

NMOS

TRANSMISSION GATE CIRCUITRY FOR HIGH VOLTAGE TERMINAL

BACKGROUND OF THE INVENTION

1. Field of the Invention

This invention relates in general to electronic circuitry and specifically to transmission gates for electronic circuitry.

2. Description of the Related Art

Transmission gates are used to selectively enable or disable a current path in electronic circuitry. In one example, a transmission gate utilizes an NMOS transistor and a PMOS transistor in parallel with the gates of the transistors being connected to signals inverted from each other to selectively enable and disable a current path through the transistors.

With such an example, the transistors have to be sized to handle the voltage drop between the drain and source of each transistor when the transmission gate is in a non conductive state. Thus, the voltage drop across a transmission gate is limited by the "safe operating voltage area" of a transistor of the transmission gate.

The safe operating voltage area of a transistor can be defined as the voltage conditions over which the transistor can be expected to operate without self-damage. The safe operating voltage area of a MOSFET is determined by a number of factors that cause damage to a transistor due to an over voltage condition. For example, gate oxide damage can occur if the gate to source or gate to drain voltage exceeds the breakdown voltage of the gate oxide. Junction breakdown can occur if the source to body or drain to body reverse junction bias voltage exceeds the breakdown voltage of the junction. A turn on of the bipolar junction transistor parasitic of a MOSFET can occur when the drain to source voltage exceeds a certain voltage limit. In addition to catastrophic failure, damage to a transistor due to operating outside the safe operating voltage area can also include degradation of device performance or operating life of the transistor due to, for example, the effects of charge trapping in the gate oxide, hot carrier degradation, or negative-bias temperature instability. Other factors may contribute to defining the voltage levels of the safe operating voltage area of a transistor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, an integrated circuit includes a transmission gate circuit that can be selectively made conductive and non conductive. When non conductive, the voltage drop across the transmission gate circuit can exceed a voltage that is outside the safe operating voltage area of the transistors of the transmission gate circuit wherein the voltage drop across any one transistor of the transmission gate circuit does not exceed its safe operating voltage. Hence, the transmission gate circuit can be constructed of transistors with smaller safe operating voltage areas.

Figure 1:
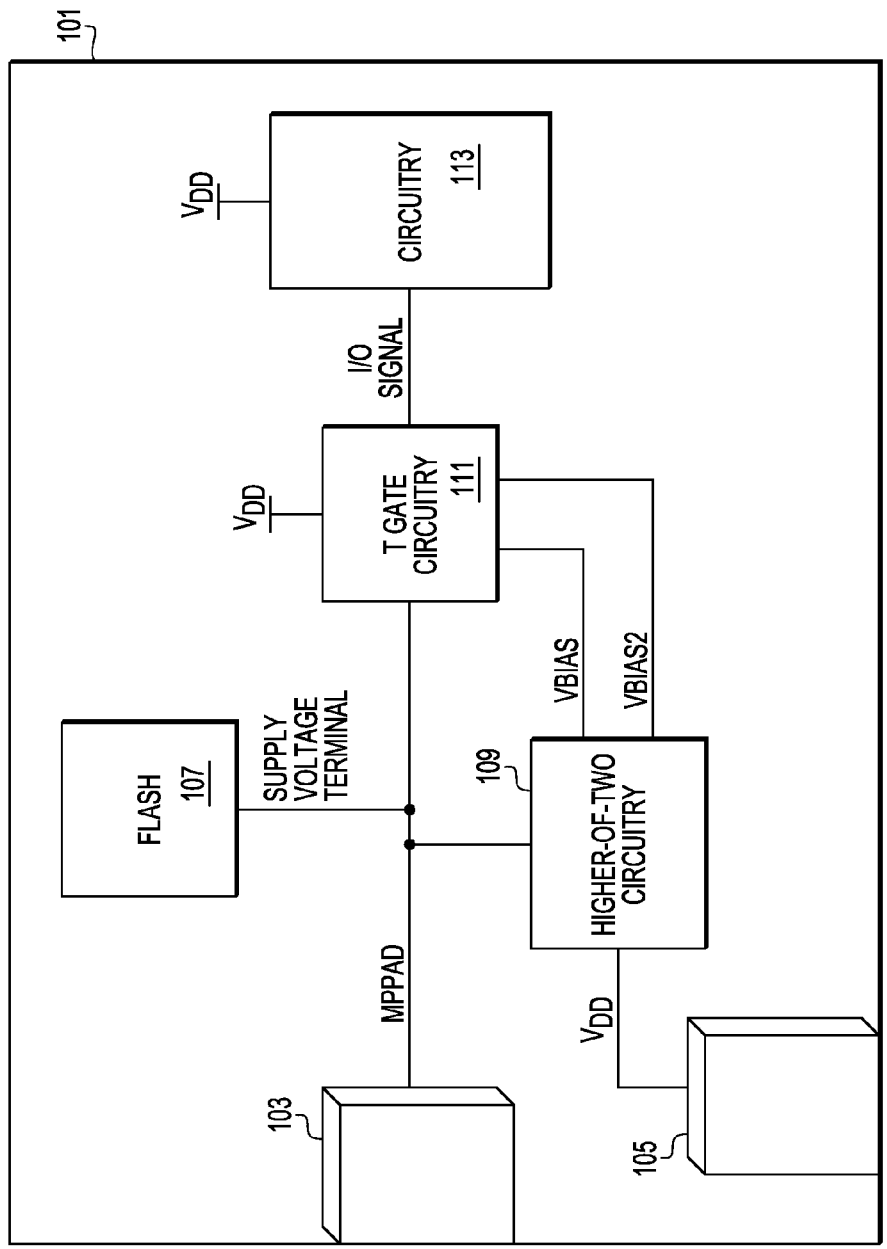
FIG. 1 is a block diagram of an integrated circuit according to one embodiment of the present invention.

FIG. 1 is a block diagram of an integrated circuit (which may alternately be referred to as an integrated circuit chip or chip) according to one embodiment of the present invention. Integrated circuit 101 includes circuitry made of transistors implemented in semiconductor material of a substrate of the integrated circuit. In the embodiment shown, integrated circuit 101 includes a flash memory 107 and other circuitry 113. Flash memory 107 includes an array of non volatile flash memory cells and associated control circuitry for addressing and controlling the reads and writes to the cells of the array. Circuitry 113 can be any number of different types of circuitry, including both digital and analog circuitry or a combination thereof. For example, circuitry 113 can include a processor, a memory, logic gates, a sensor, flip flops, an amplifier, a mixed signal circuit, or other type of electronic circuit. An integrated circuit may have other configurations and/or include other circuitry in other embodiments.

Integrated circuit 101 includes a number of pads for providing power supply voltages (e.g. VDD, VSS) to the integrated circuit and for conveying I/O signals between the integrated circuit and external circuitry. In the embodiment of FIG. 1, only two pads 103 and 105 are shown, but integrated circuit 101 may include many more. In some embodiments, integrated circuit 101 may include other circuitry associated with pad 103 such as an ESD protection circuit or buffers that are not shown in FIG. 1.

In the embodiment shown, multi purpose pad 103 can be used to provide both power to flash memory 107 for programming or erasing flash memory cells and an I/O signal to circuitry 113. As described herein, an "I/O signal" can be an input signal, an output signal, or both an input signal and an output signal. "MPPAD" refers to a signal line of integrated circuit 101 that is connected to pad 103. In some embodiments, a flash memory may be programmed by the system manufacture to load program data prior to the sale of a system. In one example, the system manufacture can use pad 103 to supply flash memory 107 with a relatively high voltage (e.g. 15V) for programming, erasing and/or testing the cells of flash memory 107. In one embodiment, flash memory 107 would only be programmable by the manufacture using pad 103 to supply the program or erase voltages. In other embodiments, integrated circuit 101 may include a charge pump (not shown) that provides a voltage (such as a lower voltage) for programming and erasing flash memory 107 when used by a user. With such an embodiment, the higher voltage provided on pad 103 would be used to more quickly program or erase flash memory 107 or for testing. Also, pad 103 can be used to provide supply voltages to circuitry 113 in some embodiments.

After the system has been manufactured and flash memory 107 has been programmed and tested, pad 103 would be coupled to external circuitry that would provide or receive an I/O signal with circuitry 113. This signal may have a lower voltage swing (e.g. 0-3 volts) to match the voltage domain of circuitry 113. In the embodiment shown, the voltage domain of circuitry 113 would be defined by the voltage level of VDD (e.g. 3 volts) which is received at pad 105.

When pad 103 is being used to supply flash memory 107 with a higher voltage (e.g. 9-15V in some embodiments), transmission gate circuitry 111 is used to electrically isolate circuitry 113 from pad 103 to prevent damage to the lower voltage domain circuitry of circuitry 113. When pad 103 is coupled to external circuitry to provide and receive an I/O signal, transmission gate circuitry 111 is made conductive so that the I/O signal can pass between pad 103 and circuitry 113. Embodiments of circuitry 111 are found in FIG. 2 and FIG. 8.

Figure 3:
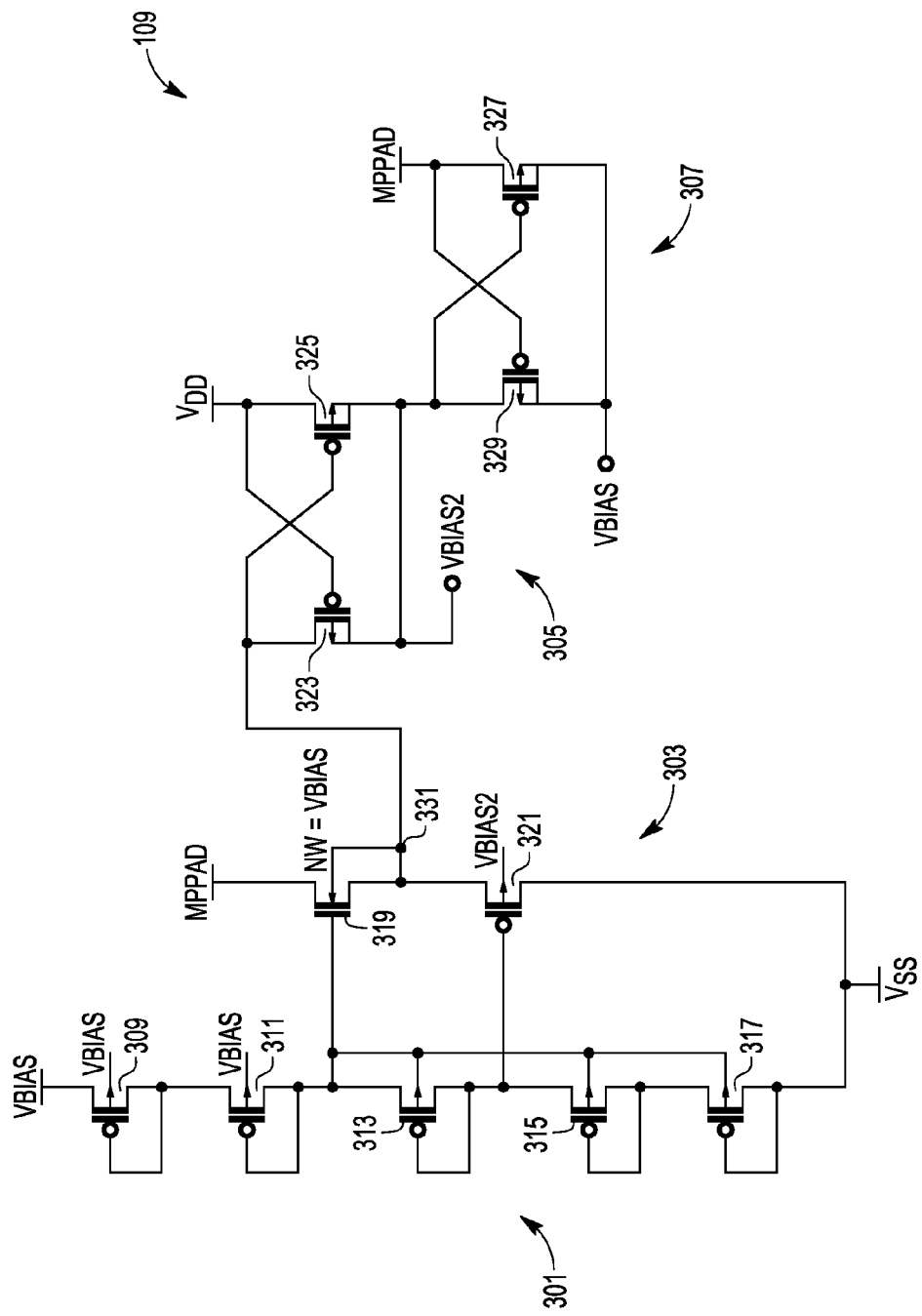
FIG. 3 is a bias signal generation circuit according to one embodiment of the present invention.

Integrated circuit 101 also includes a "higher-of-two" circuitry 109 that is used to provide a bias signal (VBIAS) having a voltage level that is the greater of VDD (the voltage level of VDD pad 105) or the voltage of VMPPAD (the voltage level of pad 103) and to provide a bias signal VBIAS2 that is the greater of VDD or half the voltage of VMPPAD. An embodiment of circuitry 109 is shown in FIG. 3.

Figure 2:
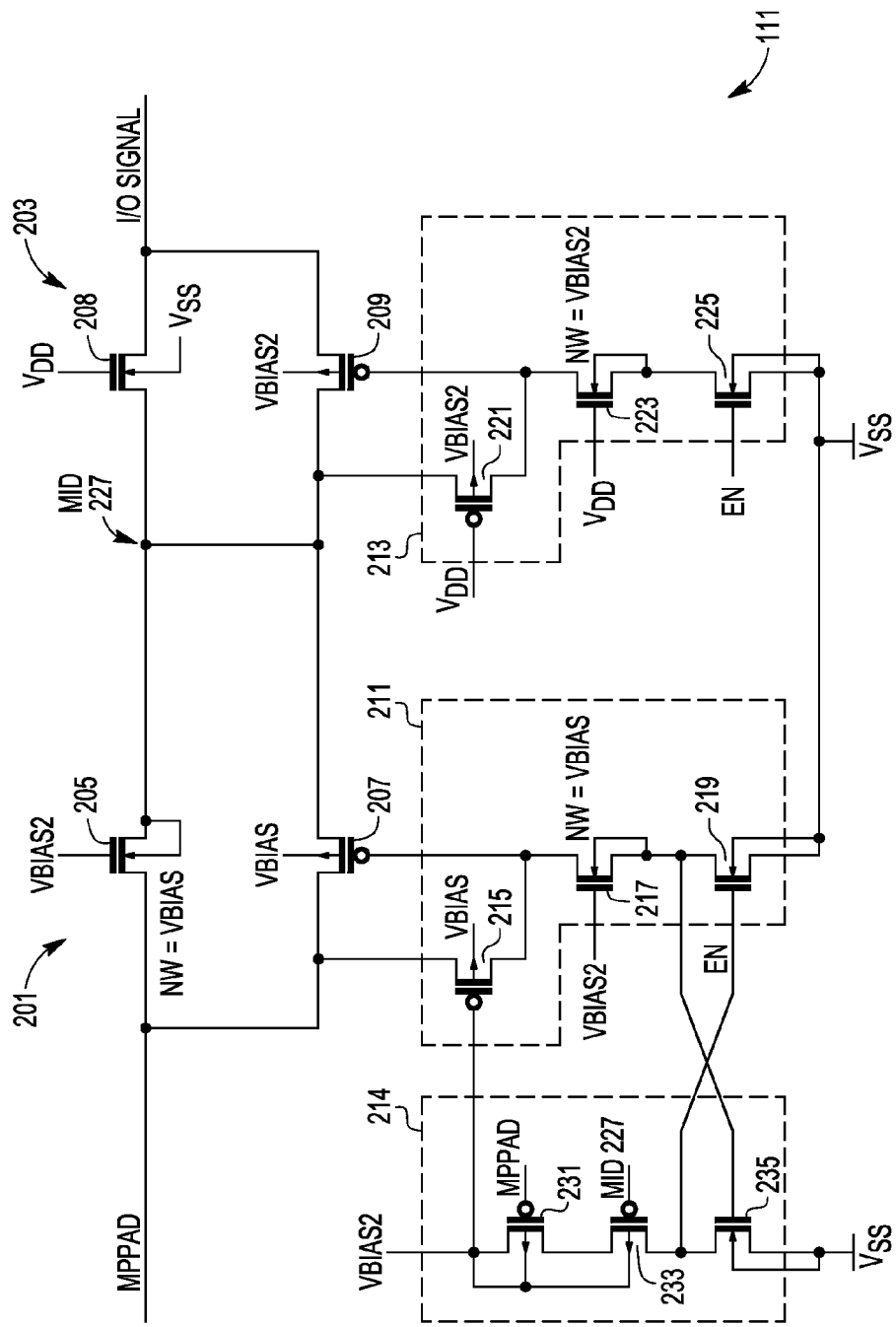
FIG. 2 is a circuit diagram of transmission gate circuitry according to one embodiment of the present invention.

FIG. 2 shows one embodiment of transmission gate circuitry 111. Circuitry 111 includes two serially connected transmission gates 201 and 203 that are connected between pad 103 (MPPAD) and a terminal of circuitry 113 (I/O Signal, both of FIG. 1). Transmission gates 201 and 203 are connected together at MID node 227. Circuitry 111 also includes a PMOS control circuit 211 for controlling the conductivity of PMOS transistor 207 and a PMOS control circuit 213 for controlling the conductivity of PMOS transistor 209. Circuitry 111 also includes a self enabling circuitry 214 for enabling circuits 211 and 213.

Transmission gate 201 includes an NMOS transistor 205 having a gate biased by VBIAS2 and a transistor body connected to the source of transistor 205. In the embodiment shown, transistor 205 is an "isolated NMOS" transistor. In one embodiment, an isolated NMOS transistor is a transistor that includes an N-well region that isolates a P-Well region of the transistor from other portions of a P type doped substrate of the integrated circuit. See FIG. 6 for an example of an isolated NMOS transistor. In the embodiment of FIG. 2, the N-well region of transistor 205 is biased at VBIAS (as indicated by "NW=VBIAS" in FIG. 2). PMOS transistor 207 has a transistor body that is biased at VBIAS.

Transmission gate 203 includes an NMOS transistor 208 having a gate biased at VDD and a transistor body biased at VSS (e.g. 0 volts). In one example, transistor 208 is not an isolated NMOS transistor and is similar to transistor 701 of FIG. 7. However, transistor 208 can be an isolated NMOS transistor where the isolating N-well region is biased to VDD or VBIAS2. The body of PMOS transistor 209 is biased to VBIAS2.

PMOS control circuit 211 includes a PMOS transistor 215 having a body biased at VBIAS, a gate biased at VBIAS2, and a source coupled to MPPAD pad 103. Circuit 211 includes an isolated NMOS transistor 217 having an N-Well biased at VBIAS, a drain connected to the gate of transistor 207 and the drain of transistor 215, a body tied to its source, and a gate biased at VBIAS2. Circuit 211 also includes an NMOS transistor 219 having a body tied to its source which is connected to a VSS terminal, a drain connected to the source of transistor 217, and a gate controlled by an enable signal (EN).

PMOS control circuit 213 includes a PMOS transistor 221 having a body biased at VBIAS2, a gate biased at VDD, and a source connected to MID node 227. Circuit 213 includes an isolated NMOS transistor 223 having an N-Well biased at VBIAS2, a drain connected to the gate of transistor 209 and the drain of transistor 221, a body tied to its source, and a gate biased at VDD. Circuit 213 also includes an NMOS transistor 225 having a body tied to its source which is connected to the VSS terminal, a drain connected to the source of transistor 223, and a gate controlled by the enable signal (EN). In one embodiment, circuit 213 does not include transistor 223 in that the voltage of MID node 227 (VMID) does not exceed the safe operating voltage area of transistors 209, 221, and 225. In such an embodiment, the drain of transistor 225 is connected to the gate of transistor 209.

Circuitry 111 acts to provide (when in a conductive state) a conductive path between MPPAD pad 103 and a terminal (I/O SIGNAL) of circuitry 113 when the voltage (VMPPAD) of pad 103 is at or below VDD (e.g. 3 volts) and isolates (in a non conductive state) circuitry 113 from pad 103 when the voltage (VMPPAD) of pad 103 is above VDD. In this way, when pad 103 is at a relatively high voltage (e.g. 15 volts such as during the programming of flash memory 107), transmission gates 201 and 203 are non conductive to isolate circuitry 113 from pad 103.

In a non conductive state, circuitry 111 is configured and operates to ensure that the transistors of circuitry 111 operate in their safe operating voltage areas when the voltage of pad 103 is in a range from above VDD to a voltage level of approximately twice the safe operating voltage area of any transistor in circuitry 111 or of a particular transistor of circuitry 111.

When VMPPAD is above VDD, VMPPAD is greater than VBIAS2, thereby making transistor 205 non conductive. Transistor 207 is also non conductive because transistor 215 is conductive (due to VMPPAD being greater than VBIAS2). Transistor 215 being conductive makes the voltage of the gate of transistor 207 equal to VMPPAD which is the voltage at the source of transistor 207. Accordingly, at this condition, transmission gate 201 is non conductive.

When transmission gate 201 is non conductive, the voltage level of MID node 227 is approximately an NMOS threshold voltage less than VBIAS2 due to the source follower configuration of transistor 205. If the voltage of MID node 227 did drop below such a level, transistor 205 would become conductive thereby pulling the voltage level of node 227 back up to VBIAS2 minus an NMOS threshold voltage. Because the voltage level of MID node 227 is VBIAS2 minus an NMOS threshold voltage and VBIAS2 is at or above half of VMPPAD at this time, the source-drain voltage of transistor 205 is limited to approximately a little more than ½ VMPPAD. In one embodiment, If VMPPAD is equal to 15 volts, the drain-source voltage of transistors 205 and 207 would be approximately 8 volts during a non conductive state. In an embodiment where the source to drain voltage boundary of the safe operating voltage area of transistors 205 and 207 is 9 volts, transistors 205 and 207 would be operating in their safe operating voltage areas when transmission gate 201 is non conductive.

In the embodiment shown, an isolated NMOS transistor is utilized for transistor 205 so that when VMPPAD is at a relatively high voltage (e.g. greater than 9 volts in some embodiments), the drain to body junction of transistor 205 is within the safe operating voltage area. This is due to the fact that the body of transistor 205 is connected to its source. The isolating N-Well region (see FIG. 6) of an isolated NMOS transistor allows for the P-Well region to be biased at a voltage (VMID) that is different from the bias voltage of the P-substrate region (VSS). For similar reasons, transistor 217 is also an isolated NMOS transistor (to keep the drain to body junction within the safe operating voltage area) in that transistor 217 is coupled to pad 103 (and subject to the relatively high voltage level) during a non conductive state of circuitry 111.

When transmission gate 201 is in a non conductive state (e.g. VMPPAD=15V), transmission gate 203 is also in a non conductive state. The gate of transistor 208 being at VDD, which is less than VMID (e.g. VMID=½ VMPPAD minus an NMOS threshold voltage) causes transistor 208 to be non conductive. In this condition, transistor 209 is also non conductive in that transistor 221 is conductive (VMID>VDD) which equalizes the gate voltage and source voltage of transistor 209. When in a non conductive state, the source to drain voltages of transistors 208 and 209 are less than VBIAS2 which is within the safe operating voltage area of those transistors.

When VMPPAD is less than or equal to VDD, transistor 207 is conductive due to transistor 215 being non conductive (VBIAS2=VDD when VMPPAD is <VDD) and transistors 217 and 219 being conductive. Transistor 219 is conductive because the enable signal is on at this time (as explained below), thereby making transistor 219 conductive to pull the source of transistor 217 to ground. Because the gate of transistor 217 is at VDD (VBIAS2=VDD when VMPPAD is <VDD) transistor 217 conducts to pull the voltage of the gate of transistor 207 to VSS, which causes transistor 207 to become conductive.

Also, when VMPPAD is less than or equal to VDD, transistor 209 is conductive due to transistor 221 being non conductive (VMID is smaller than VDD) and transistors 223 and 225 being conductive. Transistor 225 is conductive because the enable signal is on, thereby making transistor 225 conductive to pull the source of transistor 223 to ground. Because the gate of transistor 223 is at VDD, transistor 223 conducts to pull the voltage of the gate of transistor 209 to VSS, which causes transistor 209 to become conductive.

Also, when VMPPAD is less than VDD, transistor 205 is conductive because the gate of transistor 205 is at VDD (VBIAS2=VDD when VMPPAD is <VDD) and the drain and source of transistor 205 are below VDD. When transistor 205 is conductive, VMID is at VMPPAD level. Transistor 208 is therefore also conductive because the gate of transistor 208 is at VDD and the drain and source of transistor 208 are at VMPPAD (VMID=VMPPAD), which is less than VDD.

In the embodiment shown, PMOS transistor control circuits 211 and 213 enable transmission gates 201 and 203 to be in a conductive state even if the voltage level of MPPAD is just below or at VDD. At such a condition, NMOS transistors 205 and 208 alone would not guarantee a low resistive path in that they would not be fully turned on. In order to be fully turned on when VMPPAD equals VDD, the gate to source voltage of NMOS transistors 205 and 208 would need to be more than a threshold voltage above VDD. Transistors 205 and 208 are fully conductive when VMPPAD is less than VDD by more than a threshold voltage of those transistors.

In the embodiment shown, the configuration of transistor 217 in stacked configuration with transistor 219 enables transistors 215, 217, and 219 to operate in their safe operating voltage areas. As set forth above, making transistor 217 an isolated NMOS transistor keeps the drain to body junction voltage of transistor 217 within the safe operation voltage area. When the drain of transistor 217 is at a relatively high voltage when transistor 215 is conductive, transistor 217 being configured in a source follower configuration, keeps the voltage at the source of transistor 217 at an NMOS threshold voltage below VBIAS2.

Self enabling circuitry 214 acts to assert the enable signal (EN) when VMPPAD is less than VDD and dessert the enable signal when VMPPAD is greater than VDD. Circuitry 214 includes PMOS transistor 231 having a source biased at VBIAS2, a gate controlled by MPPAD, and a drain connected to the source of transistor 233. Transistor 233 has a gate connected to MID node 227. Circuitry 214 includes an NMOS transistor 235 having a gate connected to the drain of transistor 219 and a drain connected to the drain of transistor 233, the gate of transistor 219, and the gate of transistor 225. The drain of transistor 235 provides the EN signal.

When VMPPAD is below VDD, transistors 231 and 233 are conductive which biases the gates of transistors 219 and 225 at VDD (VBIAS2=VDD when VMPPAD<VDD) to make those transistors conductive. Transistor 219 being conductive pulls the gate of transistor 235 to zero to thereby make transistor 235 non conductive.

When VMPPAD is above VDD, transistor 231 is non conductive and transistor 215 is conductive. The voltage of the source of transistor 217 will be pulled towards VBIAS2 (because of the source follower configuration of transistor 217). The drain of transistor 219 being pulled to VBIAS2 causes transistor 235 to be conductive which pulls the enable signal (EN) to VSS. The enable signal going to VSS makes transistor 219 and 225 non conductive.

In some embodiments, the enable signal would be provided to switching circuitry (not shown) in flash memory 107 that would be used to isolate flash memory 107 from pad 103 when the enable signal is at a high voltage.

Some embodiments do not include self enable circuitry 214. Instead, an externally provided enable signal is used to make transistors 219 and 225 conductive when VMPPAD is equal to VDD or less. In some embodiments, the enable signal would be enabled to be provided by blowing a fuse after programming.

FIG. 3 is a circuit diagram of an embodiment of higher-of-two circuitry 109. Higher-of-two circuitry 109 includes a voltage divider stage 301 that includes PMOS transistors 309, 311, 313, 315, and 317. Each of these transistors has their gate connected to their drain. The bodies of transistors 309 and 311 are biased to VBIAS. The bodies of transistors 313, 315, and 317 are tied to the source of transistor 313. Stage 301 is used to linearly divide VBIAS into lower voltages.

Circuitry 109 includes an impedance buffer stage 303 which includes an isolated NMOS transistor 319 with a drain coupled to MPPAD pad 103, an isolation N-well region biased at VBIAS, and its body and source tied to node 331. Stage 303 also includes a PMOS transistor 321 with its source tied to node 331, its drain tied to VSS, and its body tied to VBIAS2. The body of transistor 319 is connected to its source so that when VMPPAD is at a relatively high voltage (e.g. above 9 Volts in one embodiment), the drain to body junction of transistor 319 is within its safe operating voltage area. Transistors 319 and 321 are implemented in source follower configurations to generate a voltage at node 331 that is approximately one half of VMPPAD.

Circuitry 109 includes two "higher-of-two" circuits 305 and 307. Circuit 305 includes PMOS transistors 323 and 325 and circuit 307 includes PMOS transistors 329 and 327. A higher-of-two circuit includes two inputs and an output and provides at its output the higher of the voltages of the inputs. Circuit 305 provides at its output node (VBIAS2) the higher of VDD or the voltage of node 331 (which is approximately one half of VMPPAD).

The inputs of circuit 307 are connected to the output node (VBIAS2) of circuit 305 and to MPPAD. Circuit 307 provides at its output node (VBIAS) the higher of VBIAS2 and VMPPAD. When VMPPAD is greater than VDD, VBIAS2 is always less than VMPPAD (½ of VMPPAD). Consequently, VBIAS will always provide VMPPAD in such a condition. However, when VMPPAD is equal to or less than VDD, VBIAS2 will equal VDD (in that circuit 305 provides at node VBIAS2 the greater of VDD or the voltage of node 331 which is approximately one half of VMPPAD). Accordingly, even though the inputs to circuit 307 are at VBIAS2 and VMPPAD, circuit 307 effectively provides at node VBIAS the greater of the voltages of VDD and VMPPAD. However, by using VBIAS2 as an input to circuit 307 instead of VDD, transistors 329 and 327 stay within their safe operating voltage areas even when VMPPAD is at a relatively high voltage (e.g. above 9 Volts). When VMMPAD is at a relatively high voltage, the other input (VBIAS2) is at half of its voltage. Thus, the voltage across transistors 327 and 329 is only half of VMPPAD. If circuit 307 were to include a VDD (e.g. 3 Volts) terminal as an input, then transistors would be overstressed when VMPPAD is at a very high voltage (e.g. 15 Volts).

Figure 4:
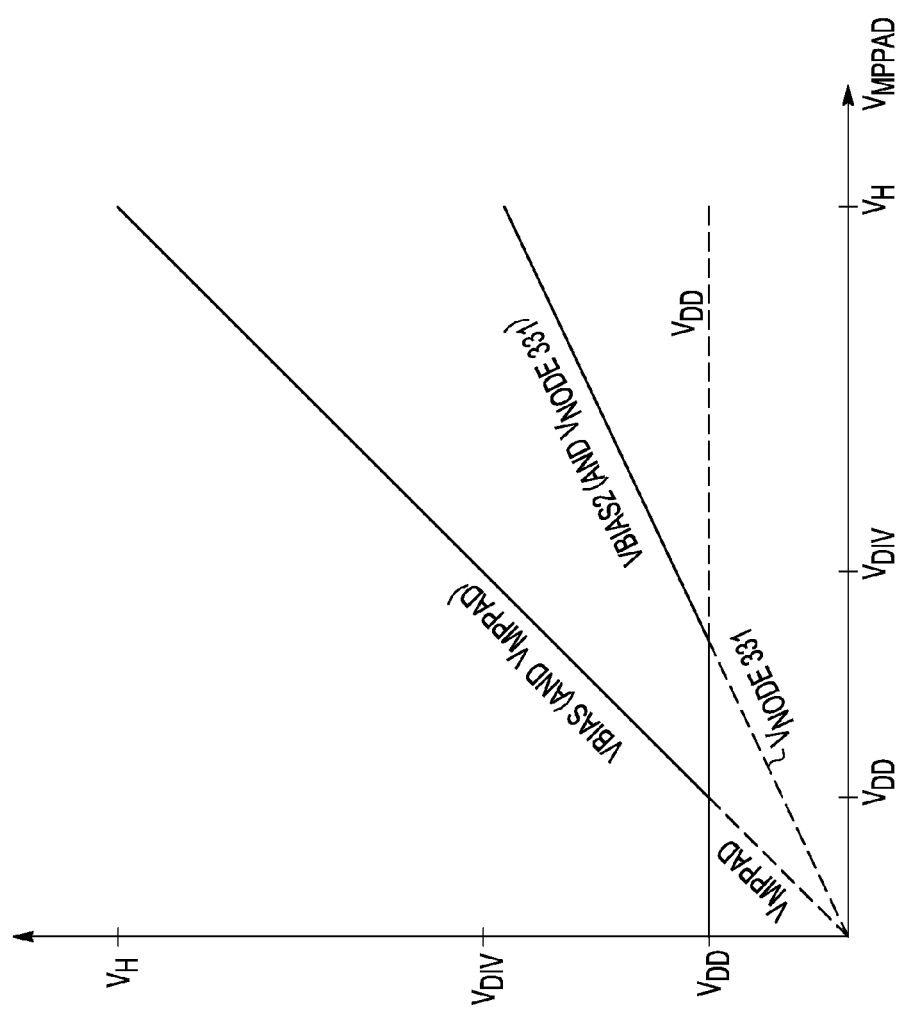
FIG. 4 is a graph showing the operation of the circuit of FIG. 1 according to one embodiment of the present invention.

FIG. 4 is a voltage diagram showing the operation of higher-of-two circuitry 111. FIG. 4 shows the value of VBIAS and VBIAS2 (shown in solid lines) with respect to VMPPAD. When VMPPAD is less than VDD (shown in FIG. 4 where the line for VMPPAD is dashed), the VBIAS is equal to VDD. When VMPPAD is greater than VDD, then VBIAS is equal to VMPPAD. When the voltage at node 331 is less than VDD (shown in FIG. 4 where the line for VNODE 331 is dashed), the VBIAS2 voltage is equal to VDD. When the voltage of node 331 is greater than VDD, then VBIAS2 equals the voltage at node 331 (i.e. approximately ½ of VMPPAD).

Figure 5:
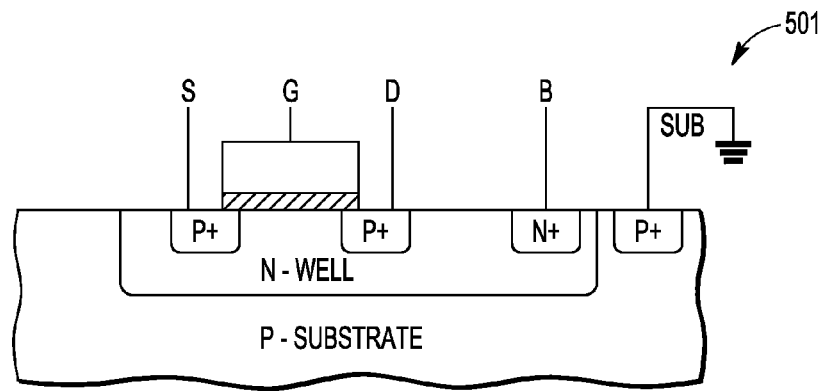
FIGS. 5-7 are cutaway side views of examples of MOSFETS used in the circuit of FIG. 1 according to one embodiment of the present invention.
Figure 6:
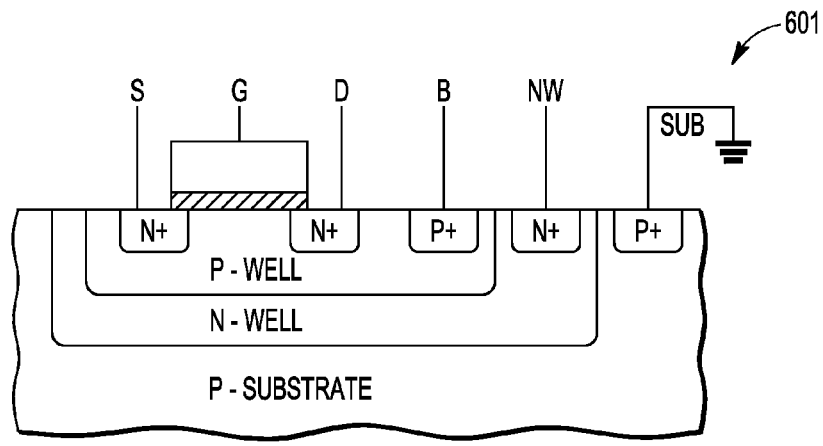
Figure 7:
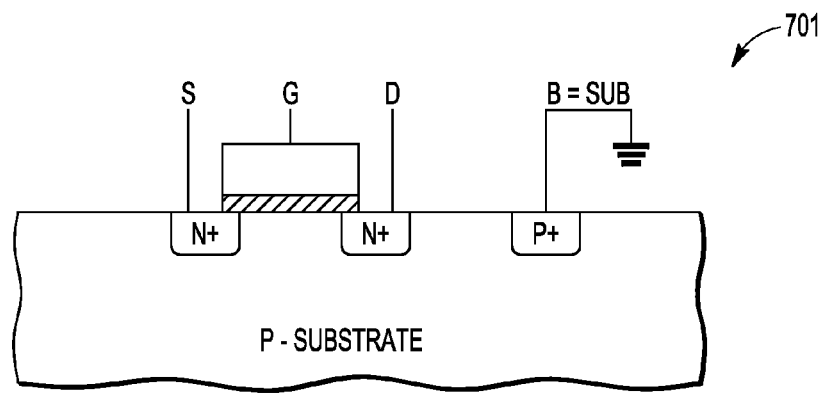

FIGS. 5, 6, and 7 show partial cross sectional views of a PMOS transistor 501, an isolated NMOS transistor 601, and an NMOS transistor 701, respectively. "S" represents the source region contact, "G" represents the gate contact, "D" represents the drain region contact, and "B" represents the body contact for biasing the body. In these Figures, the substrate is of a P-type doping that is biased at VSS. Transistor 601 includes an isolating N-well tub or region (labeled "N-Well" in FIG. 6) which completely surrounds the P-Well region and isolates it from the substrate (labeled "P-Substrate") thereby allowing the P-Well region to be biased at a different voltage than the substrate. A source region and a drain region are current electrodes for a MOSFET. A gate is a control electrode for a MOSFET.

Figure 8:
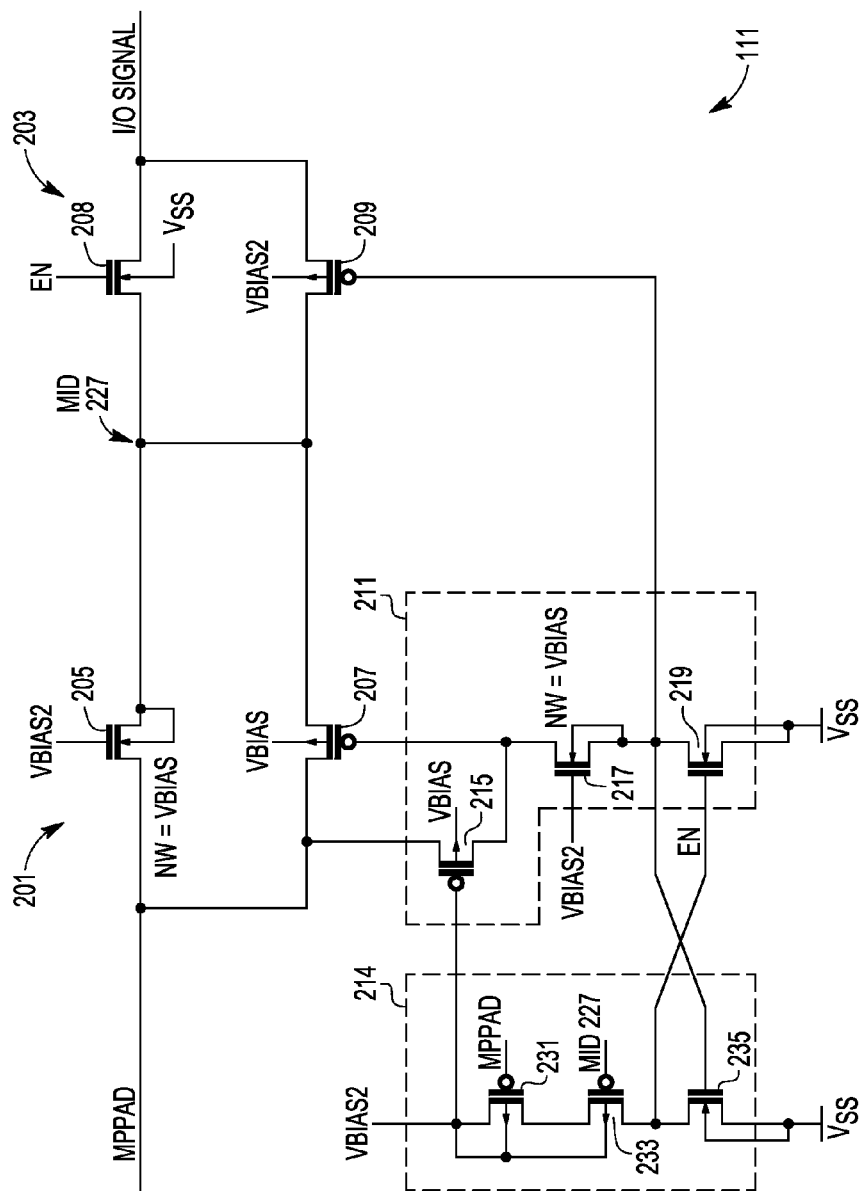
FIG. 8 is a circuit diagram of transmission gate circuitry according to another embodiment of the present invention.

FIG. 8 shows another embodiment of transmission gate circuitry 111. The circuitry of the embodiment of FIG. 8 is similar to the circuitry of the embodiment of FIG. 2, except for the circuitry controlling the gate voltages of NMOS transistor 208 and PMOS transistor 209. In the embodiment of FIG. 8, the gate of NMOS transistor 208 is connected to the gate of transistor 219 (node "EN") to receive the enable signal, and the transistor body of transistor 208 is biased at VSS. In one example, transistor 208 is not an isolated NMOS transistor. Instead it is similar to transistor 701 of FIG. 7. However, transistor 208 can be an isolated NMOS transistor where the isolating N-well region is biased to VDD or VBIAS2. The gate of PMOS transistor 209 is connected to the drain of transistor 219, and the transistor body of transistor 209 is biased at VBIAS2.

When VMPPAD is above VDD, the gate of transistor 219 (EN node) is at VSS potential and the drain of transistor 219 is held about an NMOS threshold voltage below VBIAS2 due to the source follower configuration of transistor 217. The MID node 227 is also at about an NMOS threshold voltage below VBIAS2 due to the source follower configuration of transistor 205. This makes transmission gate 203 non-conductive because the gate-source voltages of NMOS transistor 208 and PMOS transistor 209 are effectively zero volts and therefore both transistors 208 and 209 are non conductive.

When VMPPAD is below VDD, the gate of transistor 219 (EN node) is at VDD potential (VBIAS2=VDD when VMPPAD is <VDD) and the drain of transistor 219 is at VSS potential. This makes transmission gate 203 conductive because the gate of NMOS transistor 208 is at VDD potential and the gate of PMOS transistor 209 is at VSS potential and therefore both transistors 208 and 209 are conductive.

Some embodiments of FIG. 8 do not include self enable circuitry 214. Instead, an externally provided enable signal is used to make transistor 219 and transistor 208 conductive when VMPPAD is less than VDD.

In the embodiments shown or described the control circuitry and transmission gates are implemented with MOSFETS. However, other embodiments may be implemented with other types of transistors including the transmission gates implemented with other types of switching devices. Also, other embodiments may include a different number of transmission gates.

The embodiments shown and described herein provide for a transmission gate circuit where the voltage drop across the transmission gate circuit, when in a non conductive mode, can be outside of the safe operating voltage areas of the transistors of the transmission gate wherein the voltage drop across any one transistor of the transmission gate circuit does not exceed its safe operating voltage. Hence, the transmission gate circuit can be constructed of transistors with smaller safe operating voltage areas. In some embodiments, transistors having smaller safe operating voltage areas typically are faster, easier to make, and/or occupy less area than transistors with higher safe operating voltage areas.

In one embodiment, a transmission gate circuit includes a first transmission gate comprising a first switching device having a first current electrode, a second current electrode, and a control electrode. The transmission gate circuit includes a second transmission gate comprising a second switching device having a first current electrode, a second current electrode, and a control electrode. The first current electrode of the second switching device is coupled to the second current electrode of the first switching device. The transmission gate circuit includes a first terminal coupled to the first current electrode of the first switching device, a second terminal coupled to the second current electrode of the second switching device, and control circuitry coupled to the first transmission gate and the second transmission gate. In a first mode, the control circuitry places the first transmission gate and the second transmission gate into a conductive state to provide a conductive path between the first terminal and the second terminal through the first transmission gate and the second transmission gate, and when the control circuitry is in a second mode, the control circuitry places the first transmission gate and the second transmission gate into a non-conductive state. When the control circuitry is in the second mode and a voltage of the first terminal is outside a safe operating voltage area of at least one of the first switching device and the second switching device, the first switching device remains within its safe operating voltage area and the second switching device remains within its safe operating voltage area.

In an embodiment of an integrated circuit comprising a first terminal, transmission gate circuitry coupled to the first terminal, and first circuitry coupled to the transmission gate circuitry, a method includes when a voltage of the first terminal is at or below a first voltage, placing the transmission gate circuitry into a conductive state to provide a conductive path between the first terminal and the first circuitry through the transmission gate circuitry. When the voltage of the first terminal is above the first voltage, the method further includes placing the transmission gate circuitry into a non-conductive state wherein the first circuitry is isolated from the first terminal and when the voltage of the first terminal is outside a safe operating voltage of at least one transistor within the transmission gate circuitry, maintaining each transistor within the transmission gate circuitry within its safe operating voltage area.

In another embodiment, a transmission gate circuit includes a first transmission gate having a first terminal and a second terminal, and comprising a first NMOS transistor and a first PMOS transistor. The first NMOS transistor is coupled in parallel with the first PMOS transistor. A control electrode of the first NMOS transistor is coupled to a terminal of a first bias voltage. The transmission gate circuit includes a second transmission gate having a third terminal and a fourth terminal and comprising a second NMOS transistor and a second PMOS transistor. The second NMOS transistor is coupled in parallel with the second PMOS transistor. The third terminal is coupled to the second terminal. The transmission gate circuit includes a third PMOS transistor having a first current electrode coupled to the first terminal, a second current electrode coupled to a control electrode of the first PMOS transistor, and having a control electrode coupled to the terminal of the first bias voltage. The transmission gate circuit includes a third NMOS transistor having a first current electrode coupled to the second current electrode of the third PMOS transistor, a second current electrode, and a control electrode coupled to the terminal of the first bias voltage. The transmission gate circuit includes a fourth NMOS transistor having a first current electrode coupled to the second current electrode of the third NMOS transistor, a second current electrode, and a control electrode coupled to receive an enable signal. When the enable signal is asserted, each of the first transmission gate and the second transmission gate is placed in a conductive state to provide a conductive path between the first terminal and the fourth terminal through the first transmission gate and the second transmission gate and when the enable signal is deasserted, each of the first transmission gate and the second transmission gate are placed in a non-conductive state.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A transmission gate circuit, the transmission gate circuit comprising:
    a first transmission gate comprising a first switching device having a first current electrode, a second current electrode, and a control electrode;
    a second transmission gate comprising a second switching device having a first current electrode, a second current electrode, and a control electrode, and wherein the first current electrode of the second switching device is coupled to the second current electrode of the first switching device;
    a first terminal coupled to the first current electrode of the first switching device;
    a second terminal coupled to the second current electrode of the second switching device; and
    control circuitry coupled to the first transmission gate and the second transmission gate, wherein in a first mode, the control circuitry places the first transmission gate and the second transmission gate into a conductive state to provide a conductive path between the first terminal and the second terminal through the first transmission gate and the second transmission gate, and when the control circuitry is in a second mode, the control circuitry places the first transmission gate and the second transmission gate into a non-conductive state, wherein when the control circuitry is in the second mode and a voltage of the first terminal is outside a safe operating voltage area of at least one of the first switching device and the second switching device, the first switching device remains within its safe operating voltage area and the second switching device remains within its safe operating voltage area;
    wherein the first switching device is further characterized as a first PMOS transistor, and wherein the second switching device is further characterized as a second PMOS transistor, wherein the first transmission gate comprises a first NMOS transistor coupled in parallel with the first switching device and the second transmission gate comprises a second NMOS transistor coupled in parallel with the second switching device.

2. The transmission gate circuit of claim 1 wherein a control electrode of the first NMOS transistor is coupled to a terminal of a first bias voltage, and wherein the control electrode of the second NMOS transistor is coupled to a terminal of a second bias voltage.

3. The transmission gate circuit of claim 2, wherein the first bias voltage is the greater voltage of a group consisting of approximately half the voltage of the first terminal and the second bias voltage.

4. The transmission gate circuit of claim 1 wherein the control circuitry comprises:
    a third PMOS transistor having a first current electrode coupled to the first current electrode of the first switching device, a second current electrode coupled to a control electrode of the first PMOS transistor, and a control electrode coupled to a terminal of a first bias voltage.

5. A transmission gate circuit, the transmission gate circuit comprising:
    a first transmission gate comprising a first switching device having a first current electrode, a second current electrode, and a control electrode;
    a second transmission gate comprising a second switching device having a first current electrode, a second current electrode, and a control electrode, and wherein the first current electrode of the second switching device is coupled to the second current electrode of the first switching device;
    a first terminal coupled to the first current electrode of the first switching device;
    a second terminal coupled to the second current electrode of the second switching device; and
    control circuitry coupled to the first transmission gate and the second transmission gate, wherein in a first mode, the control circuitry places the first transmission gate and the second transmission gate into a conductive state to provide a conductive path between the first terminal and the second terminal through the first transmission gate and the second transmission gate, and when the control circuitry is in a second mode, the control circuitry places the first transmission gate and the second transmission gate into a non-conductive state, wherein when the control circuitry is in the second mode and a voltage of the first terminal is outside a safe operating voltage area of at least one of the first switching device and the second switching device, the first switching device remains within its safe operating voltage area and the second switching device remains within its safe operating voltage area;

wherein the first switching device is further characterized as a first PMOS transistor, and wherein the second switching device is further characterized as a second PMOS transistor, wherein the control circuitry comprises:

a third PMOS transistor having a first current electrode coupled to the first current electrode of the first switching device, a second current electrode coupled to a control electrode of the first PMOS transistor, and a control electrode coupled to a terminal of a first bias voltage.

6. The transmission gate circuit of claim 5, wherein the first transmission gate comprises a first NMOS transistor coupled in parallel with the first switching device and the second transmission gate comprises a second NMOS transistor coupled in parallel with the second switching device.

7. The transmission gate circuit of claim 5, wherein the control circuitry further comprises:

a first NMOS transistor having a first current electrode coupled to the control electrode of the first PMOS transistor, a second current electrode, and a control electrode coupled to the terminal of the first bias voltage; and a second NMOS transistor having a first current electrode coupled to the second current electrode of the first NMOS transistor, a second current electrode coupled to a ground terminal, and a control electrode coupled to receive an enable signal.

8. The transmission gate circuit of claim 7, wherein when the voltage of the first terminal is at or below the first bias voltage, the enable signal is asserted, and, in response to the enable signal being asserted, the first PMOS transistor becomes conductive.

9. The transmission gate circuit of claim 7, wherein when the voltage of the first terminal is above the first bias voltage, the enable signal is deasserted, and, in response to the enable signal being deasserted, the first PMOS transistor becomes non-conductive.

10. The transmission gate circuit of claim 7, wherein the control circuitry further comprises:

a fourth PMOS transistor having a first current electrode coupled to receive the first bias voltage, a control electrode coupled to the first terminal, and a second current electrode;

a fifth PMOS transistor having a first current electrode coupled to the second current electrode of the fourth PMOS transistor, a control electrode coupled to the second current electrode of the first switching device, and a second current electrode; and a third MNOS transistor having a first current electrode coupled to the second current electrode of the fifth PMOS transistor and to the control electrode of the second NMOS transistor, a control electrode coupled to the second current electrode of the first NMOS transistor, and a second current electrode coupled to the ground terminal.

11. The transmission gate circuit of claim 7, wherein the control electrode of the second PMOS transistor is coupled to the second current electrode of the first NMOS transistor.

12. In an integrated circuit comprising a first terminal, transmission gate circuitry coupled to the first terminal, first circuitry coupled to the transmission gate circuitry, a method comprising:

when a voltage of the first terminal is at or below a first voltage, placing the transmission gate circuitry into a conductive state to provide a conductive path between the first terminal and the first circuitry through the transmission gate circuitry;

when the voltage of the first terminal is above the first voltage, the method further comprises:

placing the transmission gate circuitry into a non-conductive state wherein the first circuitry is isolated from the first terminal; and when the voltage of the first terminal is outside a safe operating voltage of at least one transistor within the transmission gate circuitry, maintaining each transistor within the transmission gate circuitry within its safe operating voltage area;

wherein the integrated circuit further comprises a memory coupled to the first terminal, the method further comprising:

providing a supply voltage to the first terminal for use by the memory, wherein the supply voltage is above the first voltage and outside the safe operating voltage of at least one transistor within the transmission gate circuitry; and transmitting an I/O signal between the first terminal and the first circuitry via the transmission gate circuitry, wherein a voltage of the I/O signal at the first terminal is less than or equal to the first voltage.

13. The method of claim 12, wherein when a voltage of the first terminal is at or below the first voltage, an analog signal is transmitted between the first terminal and the first circuitry.

14. The method of claim 12, wherein the transmission gate circuitry comprises a first transmission gate coupled in series with a second transmission gate, wherein each of the first transmission gate and the second transmission gate comprises an NMOS transistor and a PMOS transistor coupled in parallel, and wherein the method further comprises:

placing the PMOS transistors in a conductive state when transmitting the I/O signal between the first terminal and the first circuitry.

15. The method of claim 14, further comprising:

using the voltage of the first terminal and the voltage of a circuit node between the first transmission gate and the second transmission gate to place the PMOS transistors in a non-conductive state when applying a programming voltage to the first terminal for programming the memory.

16. A transmission gate circuit, comprising:

a first transmission gate having a first terminal and a second terminal, and comprising a first NMOS transistor and a first PMOS transistor, the first NMOS transistor being coupled in parallel with the first PMOS transistor, wherein a control electrode of the first NMOS transistor is coupled to a terminal of a first bias voltage;

a second transmission gate having a third terminal and a fourth terminal and comprising a second NMOS transistor and a second PMOS transistor, the second NMOS transistor being coupled in parallel with the second PMOS transistor, and wherein the third terminal is coupled to the second terminal;

a third PMOS transistor having a first current electrode coupled to the first terminal, a second current electrode coupled to a control electrode of the first PMOS transistor, and having a control electrode coupled to the terminal of the first bias voltage;

a third NMOS transistor having a first current electrode coupled to the second current electrode of the third PMOS transistor, a second current electrode, and a control electrode coupled to the terminal of the first bias voltage; and a fourth NMOS transistor having a first current electrode coupled to the second current electrode of the third NMOS transistor, a second current electrode, and a control electrode coupled to receive an enable signal, wherein when the enable signal is asserted, each of the first transmission gate and the second transmission gate is placed in a conductive state to provide a conductive path between the first terminal and the fourth terminal through the first transmission gate and the second transmission gate and when the enable signal is deasserted, each of the first transmission gate and the second transmission gate is placed in a non-conductive state.

17. The transmission gate circuit of claim 16, further comprising:
a fourth PMOS transistor comprising a first current electrode coupled to the control electrode of the third PMOS transistor, a control electrode coupled to the first terminal, and a second current electrode;
a fifth PMOS transistor comprising a first current electrode coupled to the second current electrode of the fourth PMOS transistor, a control electrode coupled to the second terminal, and a second current electrode coupled to the control electrode of the fourth NMOS transistor; and
a fifth NMOS transistor comprising a first current electrode coupled to the second current electrode of the fifth PMOS transistor, a control electrode coupled to the first current electrode of the fourth NMOS transistor, and a second current electrode.

18. The transmission gate circuit of claim 16, wherein a body terminal of each of the first PMOS transistor and the third PMOS transistor is coupled to a terminal of a third bias voltage, wherein the first bias voltage is the greater voltage selected from approximately half a voltage of the first terminal and a second bias voltage, and the third bias voltage is the greater voltage selected from the first bias voltage and the voltage of the first terminal.

19. The transmission gate circuit of claim 18, further comprising:
a fourth PMOS transistor having a first current electrode coupled to receive approximately half the voltage of the first terminal, a control electrode coupled to the terminal of the second bias voltage, and a second current electrode coupled to the terminal of the first bias voltage to provide the first bias voltage;
a fifth PMOS transistor having a first current electrode coupled to the terminal of the second bias voltage, a control electrode coupled to the first current electrode of the fourth PMOS transistor, and a second current electrode coupled to the second current electrode of the fourth PMOS transistor;
a sixth PMOS transistor having a first current electrode coupled to the second current electrode of the fifth PMOS transistor, a control electrode coupled to the first terminal, and a second current electrode coupled to the terminal of the third bias voltage to provide the third bias voltage; and
a seventh PMOS transistor having a first current electrode coupled to the control electrode of the sixth PMOS transistor, a control electrode coupled to the first current electrode of the sixth PMOS transistor, and a second current electrode coupled to the second current electrode of the sixth PMOS transistor.

20. The transmission gate circuit of claim 16, further comprising:
a fourth PMOS transistor comprising a first current electrode coupled to the third terminal, a control electrode coupled to the terminal of a second bias voltage, and a second current electrode coupled to the control electrode of the second PMOS transistor; and
a fifth NMOS transistor comprising a first current electrode coupled to the second current electrode of the fourth PMOS transistor, a second current electrode coupled to the second current electrode of the fourth NMOS transistor, and a control electrode coupled to receive the enable signal;
wherein a control electrode of the second NMOS transistor is coupled to a terminal of the second bias voltage.

21. The transmission gate circuit of claim 16, wherein the first NMOS transistor and the third NMOS transistor are characterized as isolated NMOS transistors each having an isolating N-well region coupled to a terminal of a third bias voltage, the third bias voltage is the greater voltage of a group consisting of the voltage of the first terminal and a second bias voltage.

22. The transmission gate circuit of claim 16, wherein:
the control electrode of the second PMOS transistor is coupled to the second current electrode of the third NMOS transistor;
wherein the control electrode of the second NMOS transistor is coupled to receive the enable signal.

* * * * *